United States Patent
Lee et al.

(10) Patent No.: US 6,468,868 B1
(45) Date of Patent: Oct. 22, 2002

(54) METHOD OF FORMING HIGH DENSITY MULTI-STATE MASK ROM CELLS

(75) Inventors: Chih-Wen Lee, Hsinchu (TW); Pei-Pei Tzuoo, Hsinchu (TW)

(73) Assignee: King Billion Electronics Co., Ltd., Chutung Hsinchu (TW)

( * ) Notice: Subject to any disclaimer, the term of this patent is extended or adjusted under 35 U.S.C. 154(b) by 64 days.

(21) Appl. No.: 09/819,184

(22) Filed: Mar. 27, 2001

(51) Int. Cl.$^7$ ............................................. H01L 21/8246
(52) U.S. Cl. ...................................................... 438/276
(58) Field of Search ................................ 438/276, 278, 438/FOR 189, FOR 205, FOR 208

(56) References Cited

U.S. PATENT DOCUMENTS

| | | | | |
|---|---|---|---|---|
| 5,960,287 A | * | 9/1999 | Kunitou | 438/275 |
| 6,200,861 B1 | * | 3/2001 | Wu et al. | 438/275 |
| 6,221,698 B1 | * | 4/2001 | Shiau | 438/128 |
| 2002/0072242 A1 | * | 6/2002 | Chang | 438/745 |

* cited by examiner

Primary Examiner—George Fourson
Assistant Examiner—Suk-San Foong
(74) Attorney, Agent, or Firm—Blakely Sokoloff Taylor & Zafman LLP

(57) ABSTRACT

A method of forming multi-state mask ROM cells on a semiconductor substrate is disclosed. The method comprises following steps. Firstly, a pad oxide layer is formed on a semiconductor substrate. Then the pad oxide layer is patterned so as to form a plurality of first coding oxide regions. Thereafter, another photoresist pattern is formed to define buried bit line regions. A plurality of predetermined buried bit line regions are defined amid the first coding oxide regions. Then, a first ion implant by implanting n-type impurities into the semiconductor substrate using the photoresist pattern as a mask. After stripping the photoresist pattern, a first thermal oxidation is performed to grow oxide layer and driving the n-type impurities into the semiconductor substrate, Three types of oxide layer are formed with different thickness. Thereafter, a conductive layer are formed and then patterned as word lines. Subsequently, a photoresist pattern is formed to define second coding region. The openings of the photoresist pattern located at regions having either first coding oxide regions or the thinnest type oxide layer thereon. Finally, an ion implant using boron ion is performed. Accordingly four states mask ROM is formed.

16 Claims, 3 Drawing Sheets

METHOD OF FORMING HIGH DENSITY MULTI-STATE MASK ROM CELLS

FIELD OF THE INVENTION

The present invention relates to a semiconductor device, and more specifically, to a single poly-gate high-density multi-state mask ROM cells.

BACKGROUND OF THE INVENTION:

Recently, with the progress of semiconductor IC's design and fabricating technology, the popular electronic merchandises, such as portable telecommunications, laptop computers, DSC (digital still camera), play-station II, PDA (personal digital assistant), MP3 player, all of them are with the characteristics of light, thin, short, and small. In such devices a very high-density non-volatile mask ROMs are demanded. To achieve very high-density mask ROM, a prior art is proposed by Bertagnoili et al., in the reference, "B. Bertagnoili et al., 'ROS: An Extremely High Density Mask ROM Technology Based On Vertical Transistor Cells', Symp. on VLSI Tech. Dig., p, 58, 1996.+ In the reference, the cells having a vertical MOS transistor in a trench which allows to use the bottom of the trench as additional self-aligned bit line, and thus to double the bit line density. The technology is enabling an approximately twofold packing density compared to conventional planar ROM.

However, for double or even multi-fold the storage capacities without increasing chip area, a mask ROM structure using a novel multi-state ($\geq 3$ kinds of state) concept is a trend. For example, if memory cells store only data "0" and "1" states, a more great number of mask ROM cell transistors should be demanded to provide storage data as compare with that of memory cells which can store four kinds of states, called multiple state mask ROM cells.

A conventional multi-value ROM stores with more than three states, in the manner that changes the threshold voltage of memory cell transistors is given by Sheng et al., in U.S. Pat. No. 5,585,297 issued on Dec. 17, 1996. In the method, a number of ion implantation stages using boron ions are performed incorporating with several mask patterns and different dosage level. The high dose boron coding implant will result in a lower junction breakdown performance of the coded MOSFET and a very high band-to band leakage current between the adjacent cells as is stated in the reference "U.S. Pat. No. 5,683,925, to Irani et al., issued on Nov. 4, 1997." Hence, Irani et al., in their patent proposed a method of fabricating the mask ROM to solve above issues. In the method, a thick gate oxide layer 18 is thermally grown within ROM array area 30, even the gate oxide 2 in the periphery 32 is thinner, as shown in FIG. 1.

An alternative method is proposed by Takiziawa et al., in U.S. Pat. No. 5,556,800 issued on Sep. 17 (1996)." Takiziawa et al., In the Takiziawa's patent, the gate insulating layer's thickness is varied to change the threshold voltage of channel region. The channel region is divided into dual parts; one divided part having a different gate oxide thickness from the other, and thus a different transitivity for ion implant. Namely, the gate electrode has different characteristics of a drain current corresponding to a gate voltage ($I_D$–$V_G$) in the channel regions adjacent to each other.

A recent U.S. Pat. No. 6,133,102 issued on Oct. 17, 2000 issued to Wu disclosed a recipe which combines the concepts of the double the bit line density and multi-state storage way to fabricate double poly- gate high density multi-state flat mask ROM cells on a silicon substrate.

An object of the present invention is to propose a simpler method than above prior art. In the method, only two oxide layer growth stages and twice ion implant incorporating with single-poly, and patterning steps are required to form such multi-state mask ROM cells.

SUMMARY OF THE INVENTION

An object of the present invention is provided a multi-state Mask ROM forming technique.

A method of forming multi-state mask ROM cells on a semiconductor substrate is disclosed. In the method, single polysilicon for word line and two ion-implant steps are required. One is for form buried bit lines and the other one is for forming coding regions. The ion implants associated with coding oxide can build up at least four states mask ROM. The method comprises following steps. Firstly, a pad oxide layer is formed on a semiconductor substrate. Then the pad oxide layer is patterned so as to form a plurality of first coding oxide regions. Thereafter, another photoresist pattern is formed to define buried bit line regions. A plurality of predetermined buried bit line regions are defined amid the first coding oxide regions. Then, a first ion implant by implanting n-type impurities into the semiconductor substrate using the photoresist pattern as a mask. After stripping the photoresist pattern, a first thermal oxidation is performed to grow oxide layer and driving the n-type impurities into the semiconductor substrate. Three types of oxide layer are formed with different thickness. Thereafter, a conductive layer are formed and then patterned as word lines. Subsequently, a photoresist pattern is formed to define second coding region. The openings of the photoresist pattern located at regions having either first coding oxide regions or the thinnest type oxide layer thereon. Finally, an ion implant using boron ion is performed. Accordingly four states mask ROM is formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The detailed processes are best illustrated by reference to the drawings, and are described as follows.

Figure 1:
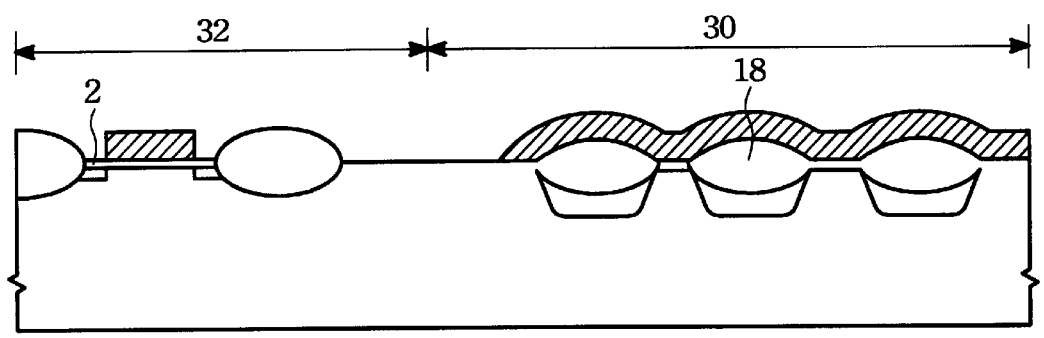
FIG. 1. is a cross-sectional view of a mask ROM cell array, in accordance with the prior art.
Figure 2:
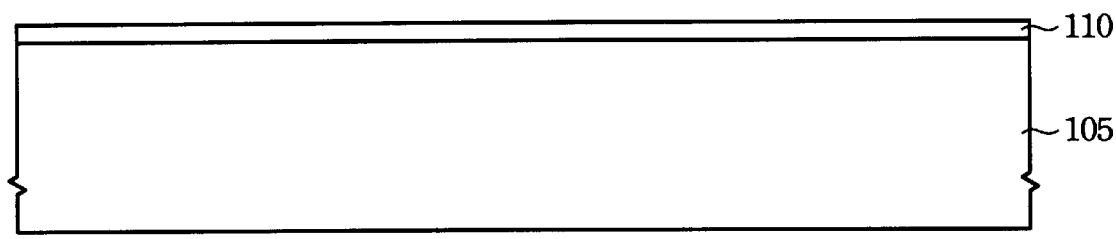
FIG. 2 is a cross-sectional view of growing an pad oxide layer on a silicon substrate in accordance with the present invention.
Figure 3:
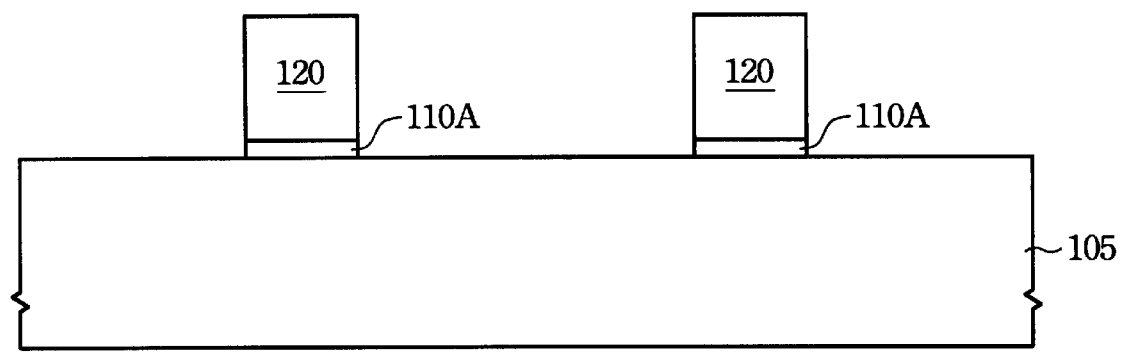
FIG. 3 is a cross-sectional view of patterning the pad oxide layer to form first coding oxide layer in accordance with the present invention.

Referring to FIG. 2, an pad oxide layer 110 as a first coding oxide layer is formed by a thermal growing method on a silicon substrate 105. The pad oxide 110 thickness is between about 20–50 nm. Then as shown in FIG. 3, a photoresist pattern 120 coated on the pad oxide layer 105 through lithographic technique is done to define the first coding oxide region 110A. A wet dipping out process using BOE (buffer oxide etching) solution is then performed to etch the exposed pad oxide layer 110 away.

Figure 4:
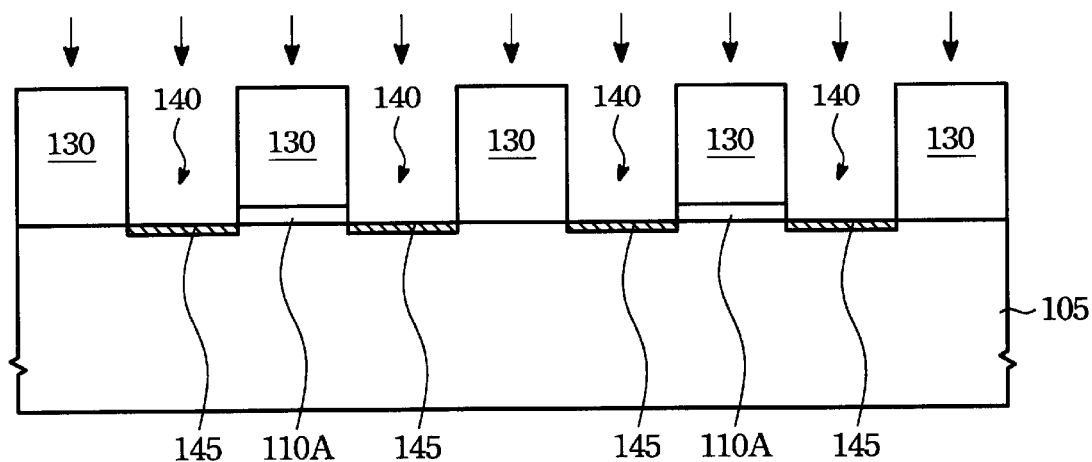
FIG. 4. is a cross-sectional view of forming a photoresist pattern to defined buried bit line regions and then performing first ion implant in accordance with the present invention.

Referring to FIG. 4, after etching, the photoresist pattern 120 is optional removed and another photoresist pattern 130 overlaid entire areas by a lithographic technique to define buried bit lines are followed. The photoresist pattern 130 contains photoresist sections covered the first coding regions 110A and a region amid two adjacent first coding regions 110A and therefore having two openings 140 in between to define buried bit line regions 140, as is shown in the FIG. 4.

Next, a first ion implant by implanting first conductive impurities through the openings 140 into the semiconductor substrate 105 (as indicated by arrow) to form doping regions 145 using the photoresist pattern 130 as a mask is implemented. In a preferred embodiment, the first conductive impurities are n-type conductive ions selected from phosphorus or arsenic ions using an energy and doses between about 10–120 keV and $5 \times 10^{14}$–$2 \times 10^{16}$/cm$^2$, respectively. After ion implant, the photoresist layer 130 is stripped away.

Figure 5:
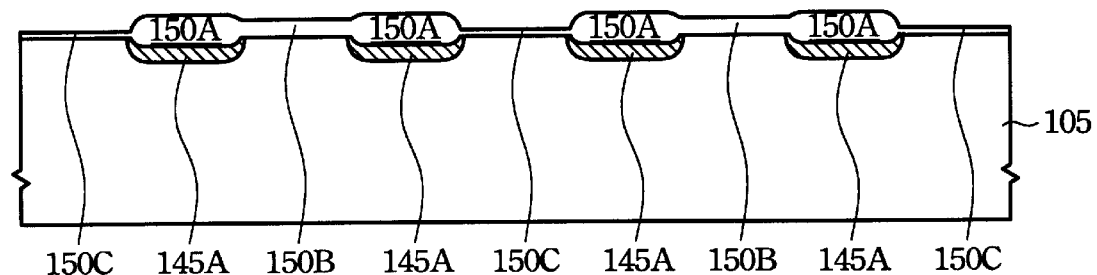
FIG. 5. is a cross-sectional view of performing thermal oxidation to grow a oxide 5 layer.

Thereafter, as shown in FIG. 5, a first thermal oxidation at a temperature between about 700–1050° C. in oxygen ambient is performed to grow a first, a second, and a third type of oxide layer 150A, 150B and 150C. The types of oxide layer are classified in accordance with their thickness. The first type of oxide layer 150A is grown at doping regions 145 and thus the oxide layer grown rapidest than any other regions, which are without conductive impurities. The first type of oxide layer 150A has a thickness between about 30–100 nm in thickness. The second type of oxide layer 150B contains first coding oxide layer and newly grown oxide layer and the thickness is between about 15–60 nm. The third type of oxide layer 150C formed at remnant regions other than first coding regions 110A and doping regions 145. It 150C contains newly grown oxide layer only and thus has the thinnest oxide layer. The thickness of third type of oxide layer 150C is between about 3–20 nm. Furthermore, during the first thermal oxidation process, the first conductive impurities in the doping regions 145 are driving into semiconductor substrate 105 to form buried bit line regions 145A.

Figure 6:
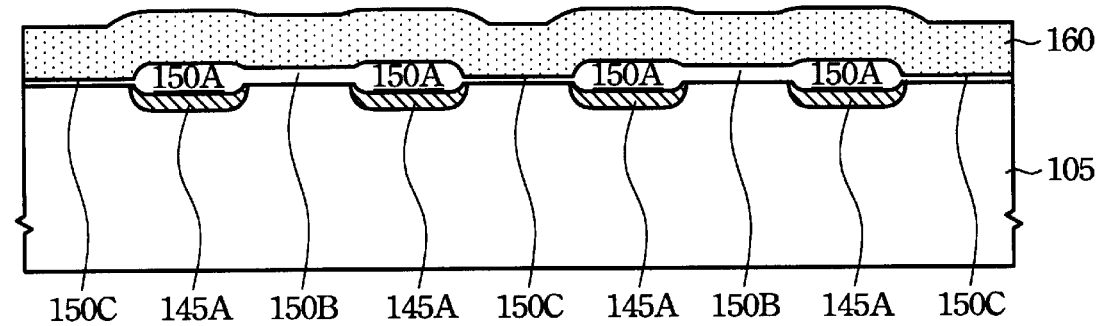
FIG. 6. is a cross-sectional view of forming first conductive layer and then patterned as word lines in accordance with the present invention.

Please refer to FIG. 6, a first conductive layer 160 between about 50–500 nm is formed on entire areas by CVD method. The material of first conductive layer 160 can be selected from in-situ doped polysilicon doping with phosphorus or arsenic, refractory metal silicide or refractory metal. Subsequently, the first conductive layer 160 is patterned to form word lines 160 through lithographic and etching process.

Figure 7:
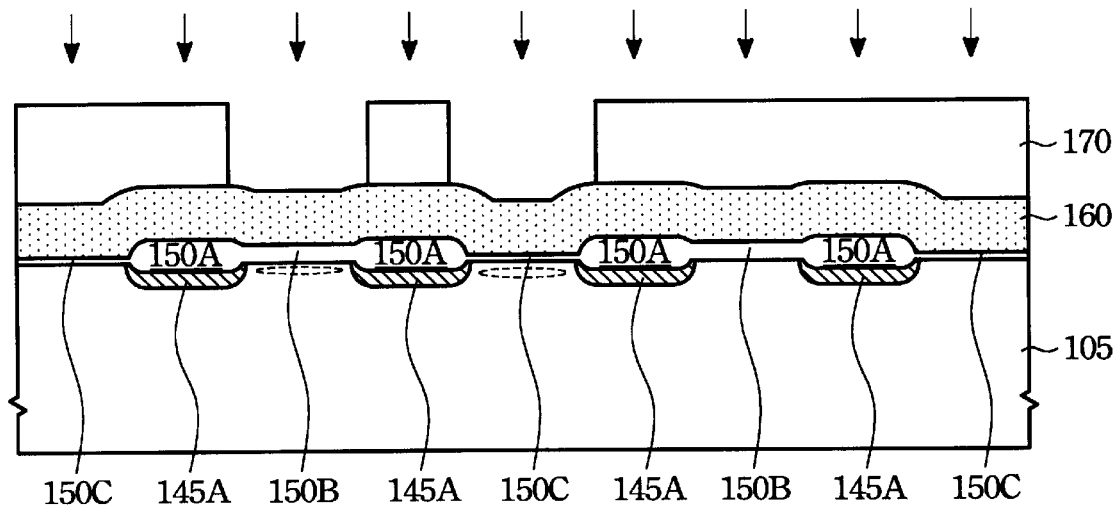
FIG. 7. is a cross-sectional view of forming a photoresist pattern to define second coding regions and then performing second ion implant in accordance with the present invention.

Referring to FIG. 7, a photoresist pattern 170 coated on entire surface is carried out to define second coding regions 180. The openings of photoresist pattern 170 are at some regions either having a second type of oxide layer 150B or a third type of oxide layer 150C thereon. Subsequently, a high-energy ion implant through the first conductive layer 170 is performed using the photoresist pattern as a mask. The step of high-energy ion implant is using p-type conductive impurities selected from boron or $BF_2^+$. The energy and doses are between about 40–300 keV and $5 \times 10^{12}$–$5 \times 10^{15}$/cm$^2$, respectively.

After ion implant, another thermal anneal is carried out to active the ions. Consequently, four kinds of threshold voltages are build-up in the different channel regions beneath forgoing three types of oxide layer 150A, 150B and 150C relying on the thickness of oxide layer and whether the regions with or without p-type conductive impurities. Accordingly, four kinds of threshold voltage are shown. There are Vt0, Vt1, Vt2, and Vt3, respectively, corresponding to third type of oxide layer without and with coding implant and, second type of oxide layer without and with coding implant. Table 1 shows several threshold voltages of NMOS mask ROMs by simulation according to the coding condition.

TABLE 1

| Sample | Coding implant (cm)$^{-2}$ | Coding Oxide Å | Vtn(V) |
|---|---|---|---|
| A | No | No | 0.69 |
| B | 1.00E + 14 | No | 2.81 |
| C | 1.00E + 14 | 300 | 7.41 |
| D | No | 300 | 1.84 |
| E | 5.00E + 14 | No | 3.95 |
| F | 5.00E + 13 | No | 6.16 |

In the table 1 the coding implant is based on conditions of $BF_2^+$, 100 keV through pad oxide 25 nm. For example, sample A is without coding implant and sample B is implant by $BF_2^+$, 100 keV and at doses of about 1.00E+14/cm$^2$.

Figure 8:
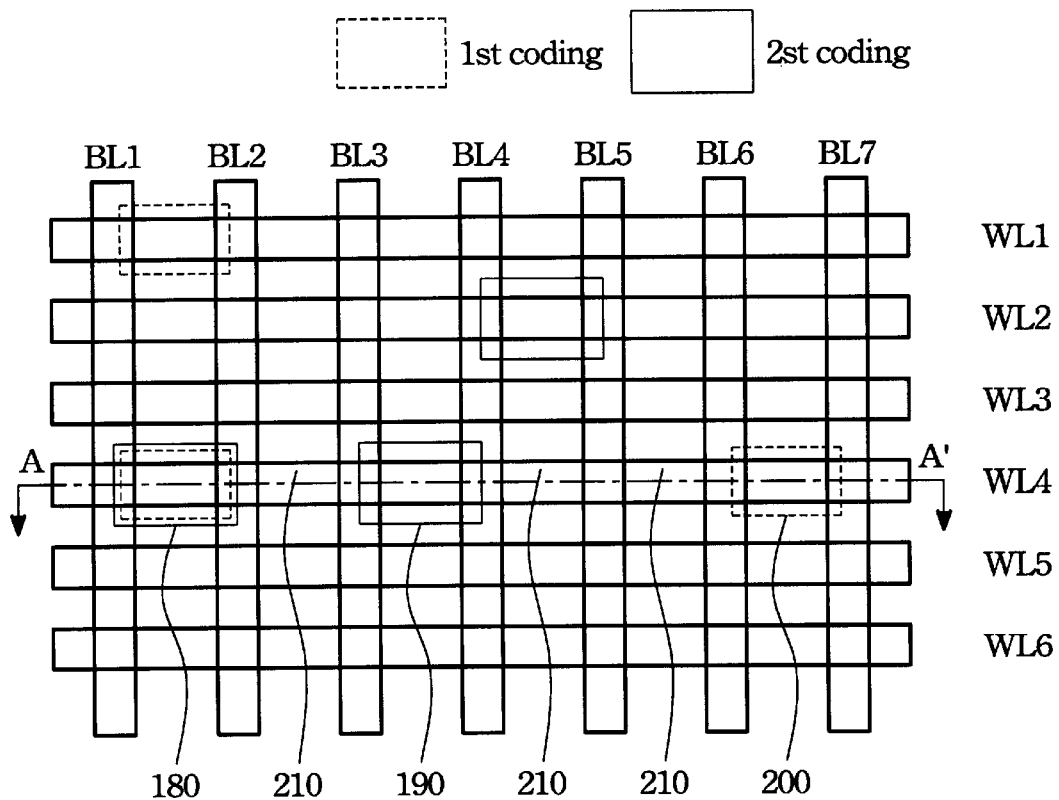
FIG. 8 Is a synoptic layout for high-density multi-state mask ROM device in accordance with the present invention.

FIG. 8 shows a synoptic layout for high-density multi-state mask ROM device in accordance with the present invention. Along line A–A', four kinds of coding conditions are shown. There are a first region 180 having a first coding oxide layer and a second coding implant, a second region 190 having a second coding implant, a third region 200 having a first coding layer, and a forth region 210 having a third type of oxide layer 150C thereon only.

The benefits of this invention are:

The high-density multi-state mask ROM cells can achieve easily by simpler processes.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure. For example, in the FIG. 4, of the preferred embodiment, only one photoresist section 130 formed amid two adjacent first coding regions 110A, however, two or more photoresist sections 130 equally spaced in between two adjacent first coding regions 110A are only one type of slight modifications.

What is claimed is:

1. A method of forming multi-state mask ROM cells on a semiconductor substrate, said method comprising the steps of:

forming a pad oxide layer on said semiconductor substrate;

patterning said pad oxide layer so as to form a plurality of first coding oxide regions;

forming a photoresist pattern on said first coding regions and said semiconductor substrate to form a plurality of first openings;

performing first ion implant by implanting first conductive impurities through said first openings into said semiconductor substrate so as to form first doping regions using said photoresist pattern as a mask;

stripping said photoresist pattern;

performing first thermal oxidation so as to form oxide first, second and third layers on said semiconductor substrate including forming an oxide layer on the regions with first coding oxide layer thereon and driving said first conductive impurities into semiconductor substrate so as to form buried bit line regions;

forming a first conductive layer on said oxide layers;

patterning said first conductive layer to define word lines;

forming a photoresist pattern on entire surface, said photoresist pattern having second openings so as to define second coding regions;

performing second ion implant by implanting second conductive impurities through said first conductive layer in said semiconductor substrate so as to form second coding regions using said photoresist pattern as a mask.

2. The method according to claim 1, wherein said first coding regions have a plurality of first openings in between.

3. The method according to claim 1, wherein said oxide first, second, and third layers containing a first oxide layer, a second oxide layer, and a third oxide layer, respectively, 30–100 nm, 15–60 nm, and 3–20 nm in thickness.

4. The method according to claim 3, wherein said first type oxide layer is formed at first doping regions, said second type oxide layer formed at first coding regions, said third type oxide layer formed at remnant regions after said first thermal oxidation.

5. The method according to claim 1, wherein said first ion implant is using an energy and dose between about 10–120 keV and $5\times10^{14}$–$2\times10^{16}$/cm$^2$, respectively, said first conductive impurities are selected from the group consisting of phosphorus and arsenic and combination thereof.

6. The method according to claim 1, wherein said step of said performing first thermal oxidation is carried out at a temperature between about 700–1050° C.

7. The method according to claim 1, wherein said second ion implant is using an energy and dose between about 40–300 keV and $5\times10^{12}$–$5\times10^{15}$/cm$^2$, respectively, said second conductive impurities are selected from the group consisting of boron and $BF_2^+$ and combination thereof.

8. The method according to claim 3, wherein said second coding regions comprises a portion of regions having either said second oxide layer or said third oxide layer thereon.

9. The method according to claim 1, further comprising a thermal annealing process so as to activate said second conductive impurities.

10. A method of forming multi-state mask ROM cells on a semiconductor substrate, said method comprising the steps of:

forming a pad oxide layer on said semiconductor substrate;

patterning said pad oxide layer so as to form a plurality of first coding oxide regions spaced from each other;

forming a photoresist pattern to overlay said first coding oxide regions and a plurality of regions amid said first coding oxide regions so as to form a plurality of first openings;

performing first ion implant by implanting first conductive impurities through said first openings into said semiconductor substrate so as to form first doping regions using said photoresist pattern as a mask;

stripping said photoresist pattern;

performing first thermal oxidation so as to grow first, second, and third oxide layers on said semiconductor substrate and driving said first conductive impurities into said semiconductor substrate, said first oxide layer being formed at first doping regions, said second oxide layer being regions with first coding oxide layer thereon, said third oxide layer being remnant regions;

forming a first conductive layer on said oxide layers;

patterning said first conductive layer to define word lines;

forming a photoresist pattern on entire surface to define second coding region, said defined second coding regions having either said first coding oxide regions or said third type oxide layer thereon; and performing second ion implant by implanting second conductive impurities through said first conductive layer into said semiconductor substrate so as to form second coding regions using said photoresist pattern as a mask.

11. The method according to claim 10, wherein said first oxide layer, said second oxide layer, and said third oxide layer, respectively, are 30–100 nm, 15–60 nm, and 3–20 nm in thickness.

12. The method according to claim 10, wherein said first ion implant is using an energy and dose between about 10–120 keV and $5\times10^{14}$–$2\times10^{16}$/cm$^2$, respectively, said first conductive impurities are selected from the group consisting of phosphorus and arsenic and combination thereof.

13. The method according to claim 10, wherein said step of said performing first thermal oxidation is carried out at a temperature between about 700–1050° C.

14. The method according to claim 10, wherein said second ion implant is using an energy and dose between about 40–300 keV and $5\times10^{12}$–$5\times10^{15}$/cm$^2$, respectively, said second conductive impurities are selected from the group consisting of boron and $BF_2^+$ and combination thereof.

15. The method according to claim 10, further comprising a thermal annealing process so as to activate said second conductive impurities.

16. The method according to claim 10, wherein said step of forming a photoresist pattern to overlay said first coding oxide regions includes forming at least one photoresist section in between any two adjacent first coding oxide regions.

* * * * *

UNITED STATES PATENT AND TRADEMARK OFFICE
CERTIFICATE OF CORRECTION

PATENT NO. : 6,468,868 B1 Page 1 of 1
DATED : October 22, 2002
INVENTOR(S) : Lee et al.

It is certified that error appears in the above-identified patent and that said Letters Patent is hereby corrected as shown below:

Column 5,
Line 25, after "respectively," please insert -- are --.
Lines 28-30, please delete all occurrences of the term "type".

Signed and Sealed this

Seventeenth Day of August, 2004

JON W. DUDAS
*Acting Director of the United States Patent and Trademark Office*